United States Patent
Kengeri et al.

(10) Patent No.: US 7,200,793 B1
(45) Date of Patent: Apr. 3, 2007

(54) ERROR CHECKING AND CORRECTING FOR CONTENT ADDRESSABLE MEMORIES (CAMS)

(75) Inventors: Subramani Kengeri, San Jose, CA (US); David Walter Carr, Nepean (CA); Paul Nadj, Ottawa (CA); Jaya Prakash Samala, San Jose, CA (US)

(73) Assignee: Altera Corporation, San Jose, CA (US)

(*) Notice: Subject to any disclaimer, the term of this patent is extended or adjusted under 35 U.S.C. 154(b) by 633 days.

(21) Appl. No.: 10/106,305

(22) Filed: Mar. 22, 2002

(51) Int. Cl.
*G11C 29/00* (2006.01)

(52) U.S. Cl. .............. 714/768; 702/117; 711/108; 711/221

(58) Field of Classification Search ............. 714/768; 365/49, 236, 50; 711/103, 108, 221; 702/117
See application file for complete search history.

(56) References Cited

U.S. PATENT DOCUMENTS

| | | | | |
|---|---|---|---|---|
| 5,848,074 A | * | 12/1998 | Maeno | 714/720 |
| 6,000,006 A | * | 12/1999 | Bruce et al. | 711/103 |
| 6,690,595 B1 | * | 2/2004 | Srinivasan et al. | 365/49 |
| 6,741,253 B2 | * | 5/2004 | Radke et al. | 345/531 |
| 2002/0029123 A1 | * | 3/2002 | Miyatake et al. | 702/117 |

* cited by examiner

*Primary Examiner*—Guy J. Lamarre
(74) *Attorney, Agent, or Firm*—Martine Penilla & Gencarella, LLP

(57) ABSTRACT

Error checking and correcting (ECC) is performed on data held in a content addressable memory. An error check circuit receives words from a memory circuit or circuits, generates an error status and generates a corrected value when appropriate. A control circuit sequences through each of the words of the memory circuit(s), periodically reads from the memory circuit the next word in the sequence and provides the next word to the error check circuit. The bandwidth consumed by the periodic error check phase can be controlled by adjusting the interval between reads.

21 Claims, 3 Drawing Sheets

ERROR CHECKING AND CORRECTING FOR CONTENT ADDRESSABLE MEMORIES (CAMS)

BACKGROUND INFORMATION

1. Field of the Invention

The invention relates to the general field of memory circuits and devices for digital systems. Particularly, it relates to error checking and correcting (ECC) within content addressable memories (CAMs).

2. Description of Related Art

A typical memory circuit in an integrated circuit (IC) or digital system holds a fixed number of bits or binary digits, that is entries that can be either zero "0" or one "1". In most memory circuits, devices or systems, the bits are arranged in a rectangle; that is, the memory contains many words (4 million words for example) of data, each word containing a number of bits (32 bits for example). When a processor or another part of the digital system wants to store data into or retrieve data from a typical memory circuit, it simply specifies the address (between zero and 4 million minus one) of the word desired.

Content addressable memories (CAMs) are rather unlike typical memories and their use in modern digital systems is increasing at a dramatic rate. When writing information into a content addressable memory, the data written is divided into a key and a value. When looking up data from the memory, a desired key is specified. The CAM looks for that particular key and either gives back the value previously stored along with the key, or it generates a "miss" flag indicating that no match was found for the desired key. As an analogy, think of the key as being someone's name, and the associated value as being that person's phone number.

Using computers and other digital systems to perform such lookup operations is hardly new. However, a content addressable memory circuit, device or system implements the lookup process in specially designed hardware. The lookup process in a hardware CAM can be performed at a very high rate, approaching if not equaling the rate possible for reading data from a simple rectangular memory circuit.

Needless to say, designing and building a content addressable memory operable at a high speed is substantially more complex than building a simple memory of equivalent capacity to hold information. In particular, a complex circuit is required to compare many stored keys at the same time to determine which, if any, match the desired key specified by the lookup operation.

Another issue with modern memory circuits is that information or data held in memory circuits within is subject to a number of conditions that occasionally cause errors to arise in the data. Such causes include but are not limited to electronic noise that arises during the read or write processes, cross talk from other bits within the memory and decay within the bit storage circuit—often but not always decay over time of an electric charge.

Various error checking and correcting (ECC) techniques are known in the art. Techniques for error detection, correction or both in digital systems include but are not limited to parity, parallel parity, cyclic redundancy checks (CRC) and Hamming codes.

These techniques are based on redundant information. Redundancy is added to data when it is stored in a memory. Then, when the information is read, the data and redundancy are checked for consistency. As an analogy, if a calendar entry indicates that a meeting starts at 1:30, ends at 2:30 and lasts one and one half hours, then there must be an error in the entry; although we can not tell which of the three data points is incorrect without further information.

Codes that provide single error correction and double error detection (SECDED) code are commonly used in modern digital systems. SECDED codes add enough redundancy that if one bit within a word or other unit of memory erroneously changes from zero "0" to one "1" (or visa versa), then which bit changed can be identified, that bit can be inverted and thus the data can be recovered. Further, SECDED codes add enough redundancy that if two bits erroneously change, then the occurrence of the changes can be detected, but the correct value for the data can not be recovered because it is not possible to determine which bits changed.

Content addressable memories complicate memory design and manufacture. Error checking and correcting schemes also complicate memory design and manufacture. Few if any attempts to combine these technologies have been made, due to the complexity of each technology, even standing alone. Further complicating any attempt to design error checking or correcting into a CAM is the high speeds at which it is desired to operate a CAM.

For example, routing data traffic over the Internet or other networks often requires that the address explicitly present in a packet of network traffic be converted into a corresponding local address or into an intermediate address for the packet's next hop. Because many network protocols rely on small sized packets to keep the overall traffic going smoothly, successful network routers may require millions of CAM lookups per second, thus leaving little if any room for delays introduced by error checking.

SUMMARY OF THE INVENTION

Accordingly, it is desirable to have a method and apparatus for checking and correcting errors within data held in a content addressable memory.

According to the invention, an error control system is adapted for use with a memory circuit. The memory circuit is configured to form a content addressable memory. The error control system comprises an error check circuit configured to receive a word from the memory circuit and to generate an error status from that word. The error check system also comprises a control circuit configured to sequence through each of the words, to periodically read from the memory circuit a next word in the sequence and to provide the next word to the error check circuit.

In some embodiments of the invention, the rate at which the periodic reads occur can be varied, which controls what portion of the bandwidth of the memory circuit is consumed by the error check process, phase or mode.

In other embodiments of the invention, when the error check circuit detects a correctable error it generates a corrected value which the control circuit writes back into the memory circuit. In yet other embodiments, when the error check circuit detects an uncorrectable error then the control circuit activates a external error signal.

Some embodiments include more than one memory circuit, each with a corresponding error check circuits. During the error check phase of these embodiments, the next word from each of the memory circuits may be read concurrently, and those words may be concurrently provided to the corresponding error check circuit.

The error checking and correcting codes used in various embodiments of the invention include but are not limited to Hamming codes, single error detection codes, double error detection codes, single error correction codes or single error correction double error detection (SECDED) codes.

In some embodiments of the invention, the memory circuit is a compare memory within a CAM. In some CAM designs, some words in the compare memory have priority over other words in the compare memory and the matching entry with the highest priority is the correct match for the desired key. The control circuit invalidates CAM lookup operations when the priority of the word that matches the lookup operation is less than the priority of a word that has an uncorrectable error. In some of these embodiments, the priority of a particular word in the compare memory is given by the address of that particular word within the compare memory.

Yet other embodiments of the invention use a periodic error check phase with memory systems other than CAMs.

BRIEF DESCRIPTION OF THE DRAWINGS

Known methods, procedures, systems, circuits or components may be shown in the drawings in a simplified form, so as to avoid obscuring the principles of the invention. Also, details of specific embodiments of the invention may be shown, even though such details may not apply to other embodiments. Details are drawn or omitted for clarity in explaining the invention and to aid the reader's understanding.

DETAILED DESCRIPTION OF THE PREFERRED EMBODIMENT

The descriptions and discussions herein illustrate technologies related to the invention, show examples of the invention and give examples of using the invention. Known methods, procedures, systems, circuits or components may be discussed without giving details, so as to avoid obscuring the principles of the invention. On the other hand, details of specific examples or embodiments of the invention may be described, though such details may not apply to other embodiments. Details are included or omitted as needed to explain the invention so as to help the reader understand the invention.

Accordingly, the invention is not to be understood as being limited to or defined by what is discussed herein. The invention may be practiced without the specific details described herein. One skilled in the art will realize that various modifications, selections among alternatives, changes in form, and improvements may be made without departing from the principles, spirit or legal scope of the invention.

Figure 1:
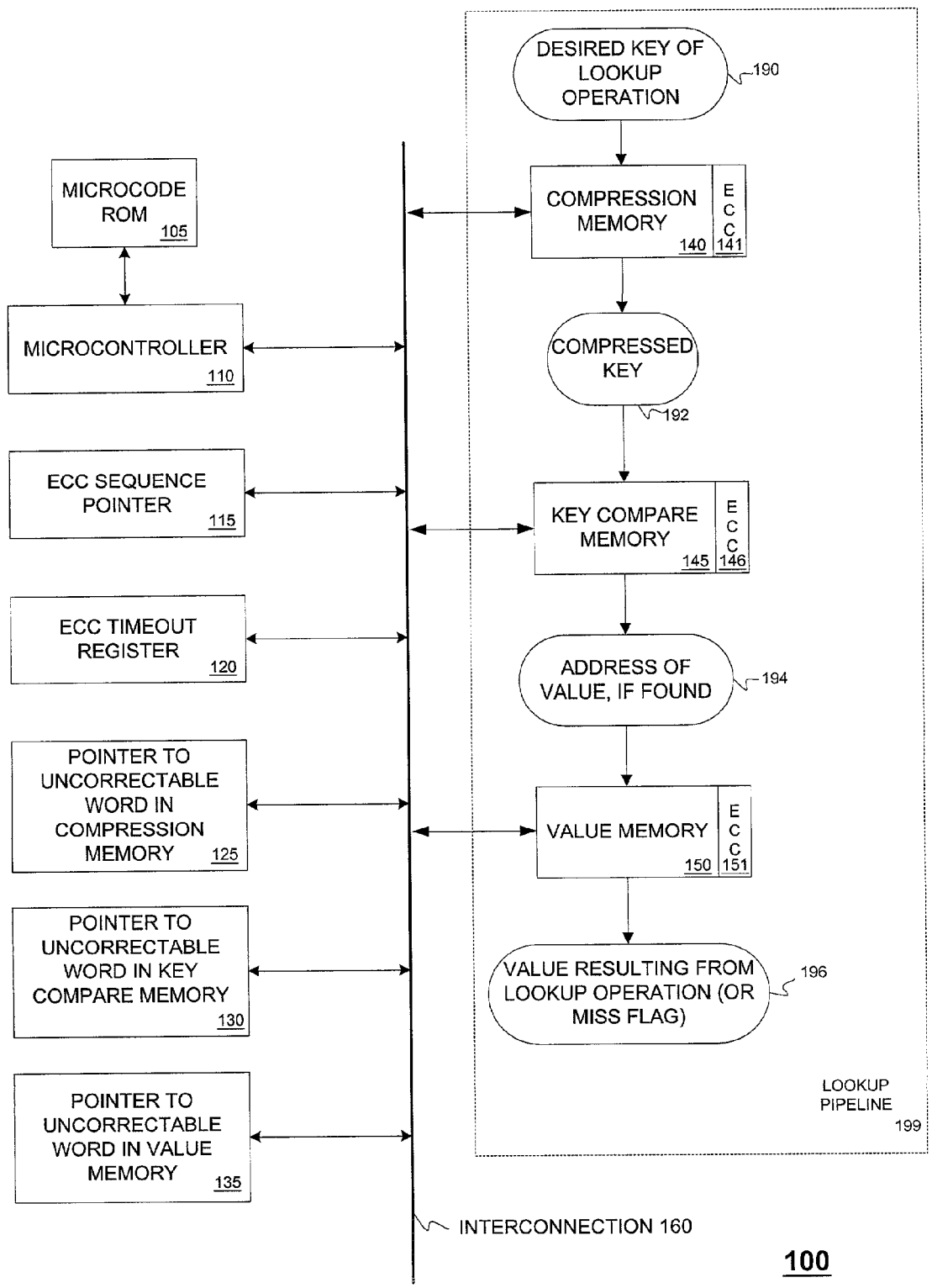
FIG. 1 illustrates the functional components and their interconnections of an error control system for a content addressable memory according to one embodiment of the invention.

FIG. 1 is an architectural block diagram of a content addressable memory according to one embodiment of the invention. The information held within CAM 100 is stored as the combination of data in compression memory 140, key compare memory 145 and value memory 150. These three memories form the three stages of lookup pipeline 199. Each of these memories has associated with it an error check circuit, respectively error check circuits 141, 146 and 151. In various embodiments of the invention error check circuits 141, 146 and 151 may implement various error correcting codes, but for the purposes of concrete discussion a single error correct double error detect (SECDED) code is assumed herein.

Key value of lookup operation 190 is the key desired or being looked for. It may be provided to optional compression memory 140, which uses it to determine compressed key 192 during the first cycle of lookup pipeline 199.

Embodiments of the invention designed for network routing may find it advantageous to use optional compression memory 140 because the least significant bits of the address to which a packet of network traffic is being sent may not be significant for intermediate routing decisions. In such cases, the least significant bits of the network address can be ignored for the purposes of the CAM lookup operation. Compression memory 140 may cause the lookup operation to ignore those bits by mapping all addresses with any value for those least significant bits to the same compressed key 192; that is, each of the locations addressed by those low order bits may contain the same compressed key 192.

In some of these embodiments, compressed key 192 may be formed by concatenating the high order bits of key value 190 with the contents of compression memory 140 at the location addressed by the low order bits of key value 190.

Compressed key 192 may be provided to key compare memory 145, which uses it to determine address of value 194 during the second cycle of lookup pipeline 199. Optionally, particularly in embodiments of the invention that do not use optional compression memory 140, key value of lookup operation 190 may be provided directly to key compare memory 145, thus eliminating one of the stages of lookup pipeline 199.

Key compare memory 145 implements concurrent bit by bit comparison between compressed key 192 and the contents of key compare memory 145 so as to find the word within key compare memory that matches compressed key 192. This occurs during the second stage of lookup pipeline 199.

In some embodiments of the invention, ternary values (that is zero "0", one "1" and don't care "X") may be used for the keys stored in key compare memory 145, for bits within compressed key 192 or both.

In other embodiments of the invention, the words of key compare memory 145 may be interpreted not as explicit key values, but rather as rules for matching key values. In some of those embodiments, the rules have priorities among them; that is a rule may be expressed as "I match a compressed key 192 that looks like my contents, provided that no rule of higher priority has already matched it". In some of those embodiments, the relative priority among rules is given by the address of the rule within key compare memory 145; thus, the matching rule with the least address (or alternatively with the greatest address) is the correct match.

In some embodiments of the invention, when a key or rule within key compare memory 145 matches compressed key 192, then the address of that key or rule equals the address of the value that was associated with the desired key in a previous write operation, that is it equals address of value 194.

In some embodiments of the invention, some bits within each word of key compare memory 145 contain information that indicates the validity of that word of the memory.

Invalid words are ignored during lookup operations.

Value memory 150 stores the value associated with a given key in the most recent CAM write operation that specified that key. During the second stage of lookup pipeline 199, value memory 150 is addressed by address of value 194 to produce value resulting from lookup operation 196. Alternatively, when no match is found within key compare memory 145, then a signal or flag is provided that a miss occurred, that is that there is no value stored in the CAM for that key.

Each of the three memory circuits (that is memories 140, 145 and 150) of lookup pipeline 199 has an associated pointer (that is pointers 125, 130 and 135) to the word within it that contains an uncorrectable error. Of course, most of the time there are no uncorrectable errors and the contents of these three registers are meaningless. However, when an uncorrectable error does occur, some software, firmware or hardware external to the memory system must rewrite the correct data into the associated memory. These pointers are used to communicate from the error checking and correcting circuitry to this external circuitry exactly where the erroneous words are located.

ECC sequence pointer 115 and ECC timeout register 120 may be used by the ECC control circuit to determine when to read the next word and what that next word is.

Optional microcontroller 110 and microcode ROM 105 may perform some of the more complex functions involved in error checking and correction. For example, they may write back the corrected data into whichever of the three pipeline memories was affected by a correctable error.

Figure 2:
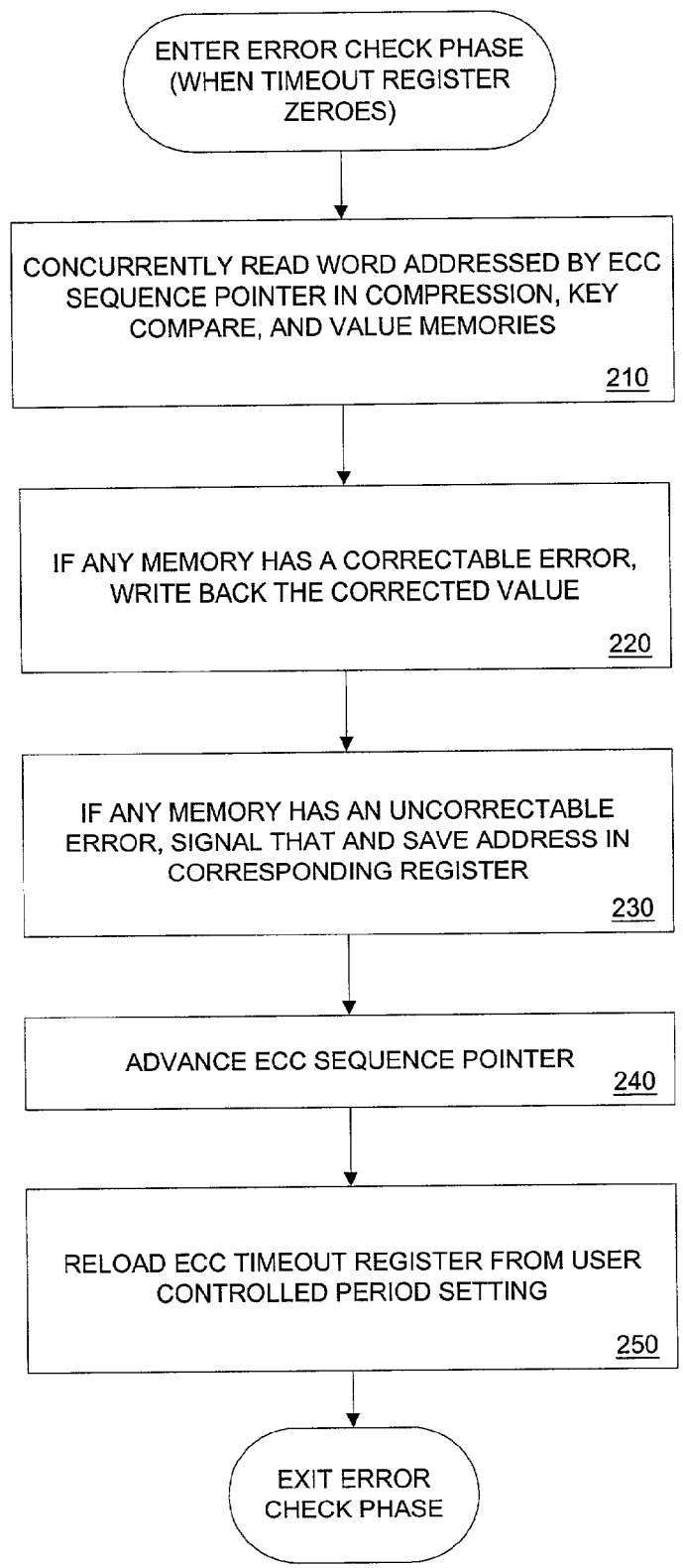
FIG. 2 shows the steps that occur during the error check phase according to one embodiment of the invention.

FIG. 2 is a flow chart of the error check phase, mode or process according to one embodiment of the invention. ECC timeout register 120 is decremented or incremented by an appropriate clock signal. When ECC timeout register 120 times out, then the error check phase is entered. It is preferable to complete any lookup operations in lookup pipeline 199 before transitioning from the normal access phase or mode to the error check phase.

The error check phase starts, in step 210, by concurrently reading a word from each of the three memories of lookup pipeline 199 and providing each word to the error check circuit (that is one of ECC 141, 146 or 151) associated with that memory. The word from each memory that is read is addressed by ECC sequence pointer 115. In some embodiments of the invention, optional compression memory has fewer words than key compare memory 145 and value memory 150 and the sequencing within compression memory simply wraps around at a faster rate than that of the other two memories.

Next in step 220, if any of those words contain a correctable error, the corrected value for that word as determined by one of ECC 141, 146 or 151 is written back into the affected memory.

Next in step 230, if any of those words contain an uncorrectable error, an external error signal is asserted. Also, the address of the erroneous word as determined by ECC sequence pointer 115 is saved in the corresponding pointer to uncorrectable word 125, 130 or 135.

Next in steps 240 and 250, ECC sequence pointer 115 is advanced and ECC timeout register 120 is reinitialized to start timing when the next error check phase starts. Optionally, the user of the system, software, firmware or hardware external to the memory system may control the length of time between error check phases, and thus the percentage of the bandwidth of lookup pipeline 199 that is consumed by the ECC phase. This may be done by providing a controllable register, the value of which is written into ECC timeout register 120 in step 250.

For certain network routing applications, approximately 3% to 5% of the bandwidth of lookup pipeline 199 may be allocated to error check phase by appropriately setting such a controllable register. This may be considered a three way tradeoff among:

Setting an acceptably small level of risk that single bit errors may deteriorate into uncorrectable two bit errors, and that detectable two bit errors may deteriorate into possibly undetectable three bit errors;

Achieving a higher throughput within the memory system in general and within lookup pipeline 199 in particular so as to minimize the delays caused by error check mode; and Setting an acceptably low level of delays in the performance of the network routing system caused by lookup pipeline 199 being in error check mode.

This completes the ECC phase, and the memory system returns to its normal operation phase.

Figure 3:
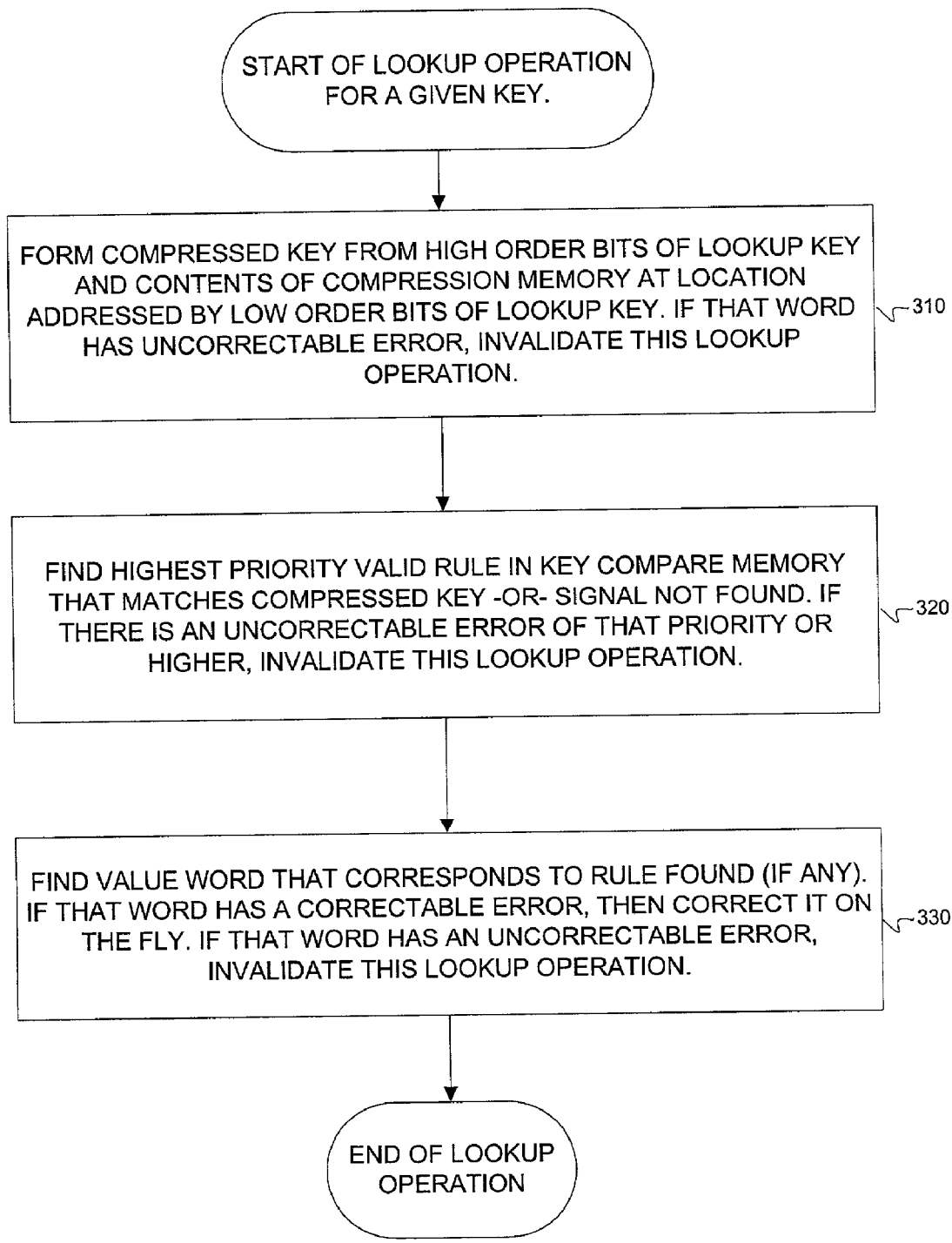
FIG. 3 shows the steps that occur during the lookup operation according to one embodiment of the invention.

FIG. 3 is a flow chart of a key lookup operation according to one embodiment of the invention.

In step 310, compressed key 192 is formed from the high order bits of lookup key 190 and the value within compression memory 140 addressed by the low order bits of lookup key 190. In some embodiments of the invention, error check circuit 141 operates on the word read from compression memory 140 with each read. When an error is detected, then some of these embodiments invalidate the results of the active lookup operation and schedule for the pipeline an error correction write back operation. The timing and complexities of the compression and comparing process may not allow on the fly error correction of this data. If an uncorrectable error is encountered, then the address of the uncorrectable is saved in pointer to uncorrectable word in compression memory 125 and the external uncorrectable error flag asserted.

In step 320, address of value 194 is determined by the CAM comparison process using key compare memory 145. In some embodiments of the invention, error check circuit 146 operates on the word read from key compare memory 145 with each read. When an error is detected, then some of these embodiments invalidate the results of the active lookup operation and schedule for the pipeline an error correction write back operation. The timing and complexities of the CAM comparing process may not allow on the fly error correction of this data. If an uncorrectable error is encountered, then the address of the uncorrectable is saved in pointer to uncorrectable word in compression memory 130 and the external uncorrectable error flag asserted.

In step 330, resulting value 196 is retrieved from value memory 150. In some embodiments of the invention, error check circuit 151 operates on the word read from value memory 150 with each read. When an error is detected, then some of these embodiments support on the fly error correction of this word. If an uncorrectable error is encountered, then the address of the uncorrectable is saved in pointer to uncorrectable word in value memory 135 and the external uncorrectable error flag asserted.

A method and apparatus for checking and correcting errors within data held in a content addressable memory is disclosed herein. The embodiments described are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

We claim:

1. An error control system for use within a content addressable memory, comprising:
   a first and second memory circuit type, the first memory circuit type storing an address value of a value stored by the second memory circuit type;
   a first and second error check circuit corresponding to the first and second memory circuit type, the first and second error check circuit concurrently implementing an error correcting code determining whether an error has occurred in the address and the value; and
   a control circuit configured to periodically invoke the first and second error check circuit.

2. The error control system of claim 1, wherein a rate of the periodic invoking is adjustable.

3. The error control system of claim 1, wherein:
   the first and second error check circuit is further configured to detect a correctable error in the address value and the value; and
   the control circuit is further configured to write the corrected value back into the respective memory circuit type when the correctable error is detected.

4. The error control system of claim 1, wherein:
   the first and second error check circuits are configured to detect an uncorrectable error in the address value and the value, respectively; and
   the control circuit is configured to activate an external error signal when the uncorrectable error is detected.

5. The error control system of claim 1, further comprising:
   a third memory circuit type, the third memory circuit type configured to store a compressed representation of the address value.

6. The error control system of claim 1, wherein the error correcting code is selected from a Hamming code, a single error detection code, a double error detection code, a single error correction code and a single error correct double error detection (SECDED) code.

7. The error control system of claim 1, wherein:
   the first memory circuit type is a compare memory, the address value stored in the compare memory being prioritized relative to other stored address values.

8. The error control system of claim 7, wherein a priority of the address value in the compare memory is given by an address within the compare memory of the address value.

9. A method of checking for errors in a content addressable memory, comprising:
   holding a multiplicity of words in a content addressable memory, each word having a plurality of bits; and
   alternating between an access phase of an address stored in the content addressable memory and an error check phase of the address stored in the content addressable memory, the error check phase comprising:
   i) sequencing through each of the words;
   ii) reading a next word in the sequence; and
   iii) generating an error status from the next word.

10. The method of claim 9, wherein the error check phase has an adjustable duty cycle.

11. The method of claim 9, further comprising:
    detecting a correctable error in the next word,
    generating a corrected value for the next word when the correctable error is detected; and
    writing the corrected value back into the content addressable memory when the correctable error is detected.

12. The method of claim 9, further comprising:
    detecting an uncorrectable error in the next word; and
    activating an external signal when the uncorrectable error is detected.

13. The method of claim 9, wherein the error check phase occurs concurrently within each of a plurality of memories.

14. The method of claim 9, further comprising:
    accessing the addressable memory for a lookup operation, wherein some words in the content addressable memory have priority over other words in the content addressable memory; and
    invalidating a result of the lookup operation, when the lookup process matches a word with a priority less than the priority of a word of the compare memory that has an uncorrectable error.

15. The method of claim 9, wherein the error check phase accounts for between about 3% and about 5% of a total time allocated to the error check phase and the access phase.

16. The method of claim 9, wherein the error check phase and the access phase sequence through a pipeline of operations.

17. The method of claim 16, wherein the pipeline of operations includes,
    determining an address value stored within a key compare memory; and
    locating a value having the address represented by the address within a value memory.

18. A content addressable memory, comprising:
    at least one memory means for holding a multiplicity of words, each word having a plurality of bits;
    at least one checking means for receiving a particular word and for generating an error status from the particular word; and
    a control means for alternating between an access phase of the content addressable memory and an error check phase of the content addressable memory
    wherein an amount of the alternating is controlled through a register setting.

19. The content addressable memory of claim 18, further comprising:
    a register having a setting controlling an amount of time between error check phases.

20. The content addressable memory of claim 19, wherein the look up pipeline sequences through a key compare memory to determine an address value for a value located within a value memory.

21. The content addressable memory of claim 18, wherein the access phase and the error check phase are executed through a look up pipeline.

* * * * *